(12) United States Patent
Tadeski et al.

(10) Patent No.: US 10,579,752 B2
(45) Date of Patent: Mar. 3, 2020

(54) GENERATING A MODEL BASED ON INPUT

(71) Applicant: Hewlett Packard Enterprise Development LP, Houston, TX (US)

(72) Inventors: Inbal Tadeski, Yehud (IL); Ron Banner, Haifa (IL); Omer Barkol, Haifa (IL)

(73) Assignee: MICRO FOCUS LLC, Santa Clara, CA (US)

( * ) Notice: Subject to any disclaimer, the term of this patent is extended or adjusted under 35 U.S.C. 154(b) by 334 days.

(21) Appl. No.: 15/309,836

(22) PCT Filed: May 12, 2014

(86) PCT No.: PCT/US2014/037709
§ 371 (c)(1),
(2) Date: Nov. 9, 2016

(87) PCT Pub. No.: WO2015/174959
PCT Pub. Date: Nov. 19, 2015

(65) Prior Publication Data
US 2017/0147721 A1 May 25, 2017

(51) Int. Cl.
*G06F 17/50* (2006.01)
*G06F 16/335* (2019.01)
(Continued)

(52) U.S. Cl.
CPC ........ *G06F 17/5009* (2013.01); *G06F 16/337* (2019.01); *G06F 16/9535* (2019.01);
(Continued)

(58) Field of Classification Search
None
See application file for complete search history.

(56) References Cited

U.S. PATENT DOCUMENTS

| 7,788,123 B1 | 8/2010 | Ekhaus et al. |
| 8,468,155 B2 | 6/2013 | Sureka |

(Continued)

FOREIGN PATENT DOCUMENTS

| CN | 101398805 A | 4/2009 |
| EP | 2546759 A1 | 1/2013 |

(Continued)

OTHER PUBLICATIONS

Adomavicius, G., & Tuzhilin, A. (2005). Toward the next generation of recommender systems: A survey of the state-of-the-art and possible extensions. IEEE Transactions on Knowledge & Data Engineering, (6), 734-749. (Year: 2005).*

(Continued)

*Primary Examiner* — Bijan Mapar

(57) ABSTRACT

Described herein are techniques for generating a model based on input. In an example, a first model can be generated based on decomposing a rating matrix into a product of two matrices U and V, where U represents correlations between users and a plurality of factors and V represents correlations between items and the plurality of factors. At least some of the users and items can be grouped into groups according to the correlations. Input on one or more of the groups can be received. A second model can be generated based on the input on the one or more of the groups.

19 Claims, 2 Drawing Sheets

(51) Int. Cl.
  *G06F 17/16* (2006.01)
  *G06Q 30/02* (2012.01)
  *G06F 16/9535* (2019.01)
  *G06Q 10/06* (2012.01)

(52) U.S. Cl.
  CPC .......... *G06F 17/16* (2013.01); *G06Q 10/067* (2013.01); *G06Q 30/0201* (2013.01); *G06Q 30/0282* (2013.01)

(56) References Cited

U.S. PATENT DOCUMENTS

| | | | |
|---|---|---|---|
| 2002/0173971 | A1 | 11/2002 | Stirpe et al. |
| 2004/0103092 | A1* | 5/2004 | Tuzhilin ............ G06F 17/30412 |
| 2010/0088265 | A1* | 4/2010 | Pohl ................... G06Q 30/02 706/46 |
| 2012/0324059 | A1 | 12/2012 | Tuzhilin et al. |
| 2013/0124449 | A1 | 5/2013 | Pinckney et al. |
| 2014/0074639 | A1 | 3/2014 | Tian et al. |
| 2014/0129500 | A1* | 5/2014 | Nice .................. G06N 5/02 706/46 |
| 2014/0278723 | A1* | 9/2014 | Liu .................. G06Q 10/0633 705/7.27 |
| 2014/0316934 | A1* | 10/2014 | Villegas Nunez ........................ G06Q 10/06393 705/26.7 |

FOREIGN PATENT DOCUMENTS

| | | |
|---|---|---|
| WO | WO-2010009314 | 1/2010 |
| WO | WO-2013153562 A1 | 10/2013 |

OTHER PUBLICATIONS

Ahn, J-W et al, "Towards fully distributed adn praivacy-preserving recommendation via expert collaborative filtering and restful linked data", Jun. 16, 2010.

Gu, Q et al, "Collaborative filtering: weighted nonnegative matrix factorization incorporating user and item graphs", Jan. 29, 2010.

Tianzi, Z. et al, "A CF recommendation method based on domain expert trust" Apr. 2013.

Mahmood, et al., "Learning and Adaptivity in Interactive Recommender Systems", ICEC '07 Proceedings of the ninth international conference on Electronic, Aug. 2007, 10 pages.

O'Donovan, et al., "PeerChooser: Visual Interactive Recommendation", CHI '08 Proceedings of the SIGCHI Conference on Human Factors in Computing Systems, Apr. 2008, pp. 1085-1088.

Zhang, et al., "Learning from Incomplete Ratings Using Nonnegative Matrix Factorization". In Proceedings of the 6th SIAM International Conference on Data Mining, Apr. 2006, pp. 548-552.

Zhao, et al., "Interactive Collaborative Filtering", CIKM '13 Proceedings of the 22nd ACM international conference on Information & Knowledge Managemen, Oct. 2013, 10 pages.

* cited by examiner

GENERATING A MODEL BASED ON INPUT

BACKGROUND

Collaborative Filtering (CF) is a technique used by some recommender systems to improve recommendations. In general, CF is the process of filtering for information or patterns using techniques involving collaboration among multiple agents, viewpoints, data sources, etc. CF has applications in both information filtering and E-commerce. For example, many web-sites, such as Amazon and Netflix, use CF in order to provide recommendations to users.

Recommender systems that incorporate CF can generate more personalized recommendations by analyzing the activity of other users with a similar taste, characteristics, viewpoints, etc., to the active user. As used herein, an active user is a user for which it is desired to predict preferences. For example, an active user may be a user shopping on an E-commerce website or browsing videos on an online video website.

An underlying assumption of the CF approach is that similar users have similar preferences. In other words, by examining the preferences of users that are in some sense similar to the active user, the recommender system can predict a ranked list of items which the active user will most probably like. By using CF, a recommender system may be able to make recommendations to an active user that are more likely to be interesting to the active user, and thus, accepted by the active user.

BRIEF DESCRIPTION OF DRAWINGS

The following detailed description refers to the drawings, wherein.

DETAILED DESCRIPTION

Figure 1:
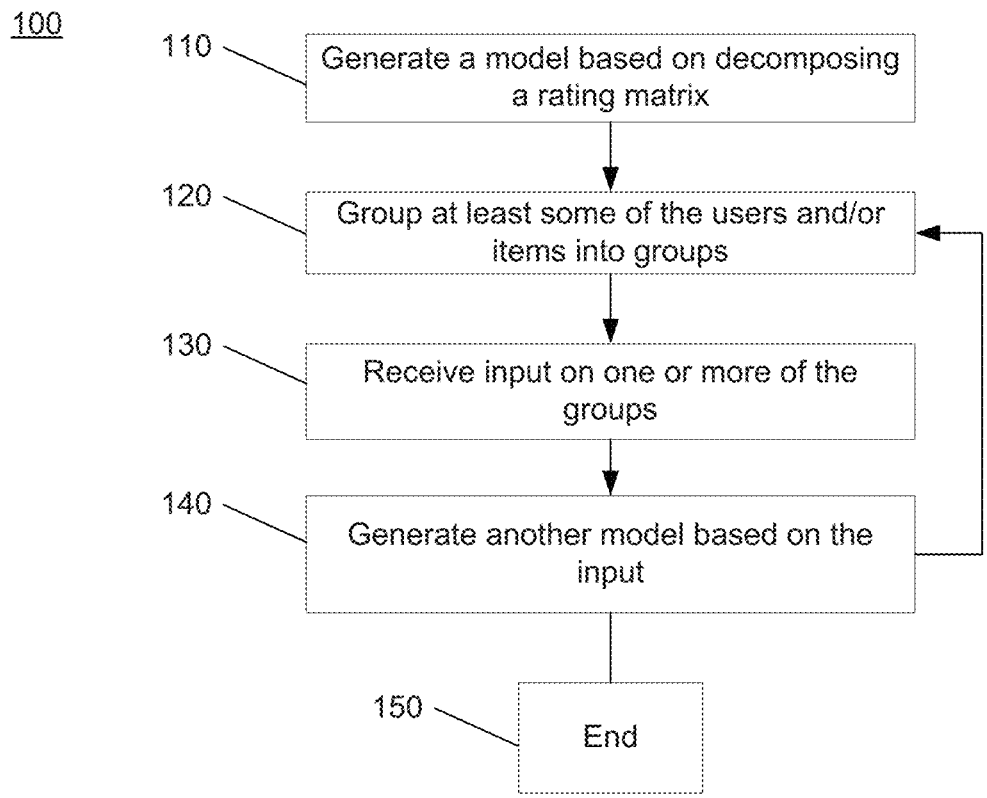
FIG. 1 illustrates a method for generating a model based on input, according to an example.

A challenge in Collaborative Filtering (CF) is that most users can access only a limited number of items. Therefore, the available data for an active user may be insufficient for identifying similar users with accuracy. This can limit the quality of recommendations and, in general, the applicability of CF. While an interactive CF approach may allow for active users to provide feedback to a recommender system, such an approach requires participation from the active user. In some cases, it may not be possible to obtain that feedback, it may take too long to gather enough feedback on the active user, or the active user may be unwilling to provide such feedback. Furthermore, sometimes CF is intended to be used by recommender systems in a transparent way such that an active user is not aware of it.

Another challenge in CF is that newly added items suffer from the "cold start" problem. What this means is that a newly added item tends to not have any user preference information associated with it since it is new. As a result, CF techniques may not take the new item into account and recommender systems may not recommend the new item until, over time, enough users have indicated a preference for the new item. For example, in the E-commerce context, the new item may not be recommended to an active user until enough users have purchased the new item.

A further challenge in CF is that there may be multiple seemingly equivalent solutions. That is, there may be multiple factors influencing whether users prefer an item and there may be some users that prefer items irrespective of reasons other users prefer the items. However, in general, only one or a small number of those factors may be the strongest reasons for the user preferences. A CF technique may not be able to differentiate between the multiple solutions and may select a weaker solution over a stronger solution if there is not enough data on the user-item preferences.

According to the techniques described herein, a model that models user-item preferences may be generated based on a rating matrix. The rating matrix may include users, items, and ratings. Each rating may represent a preference of a particular user for a particular item. The model may be generated based on decomposing the rating matrix into a product of two matrices U and V. The matrix U may represent correlations between users and a plurality of factors and the matrix V may represent correlations between items and the plurality of factors. At least some of the users and items may then be grouped into groups according to the correlations.

Input may be received on one or more of the groups. The input may be received from a user, such as a domain expert. This input may assist in injecting semantic understanding into the model, as the user may be able to see relations or the absence of relations between users or items grouped in a particular group. Examples of input may be approving or disapproving that one or more users or items belong to a particular group, moving users or items to a particular group, indicating that users or items are similar to each other, or merging or splitting one or more groups. A second model may then be generated based on the input. This second model may be able to better model the user-item preferences represented in the rating matrix than the first model. Accordingly, using the techniques described herein a more accurate user-item preference model may be generated for a recommender system, so that better recommendations can be made to active users.

Figure 2:
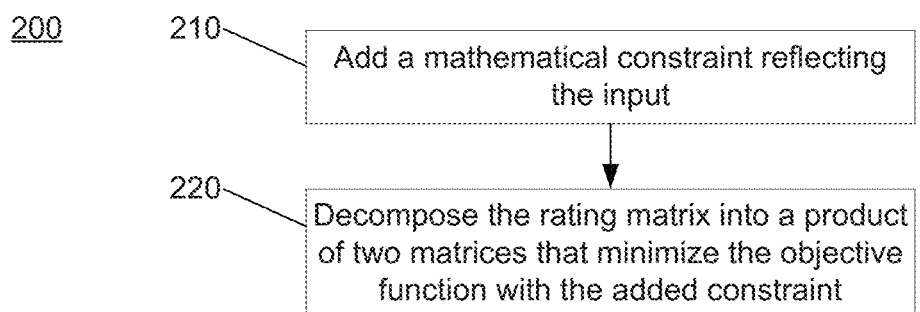
FIG. 2 illustrates a method for generating a model based on an objective function modified based on input, according to an example.

FIGS. 1 and 2 illustrate methods to generate a model based on input, according to examples. Methods 100 and 200 may be performed by a computing device, system, or computer, such as system 310 or computer 410. Computer-readable instructions for implementing methods 100 and 200 may be stored on a non-transitory computer readable storage medium. These instructions as stored on the medium are referred to herein as "modules" and may be executed by a computer.

Figure 3:
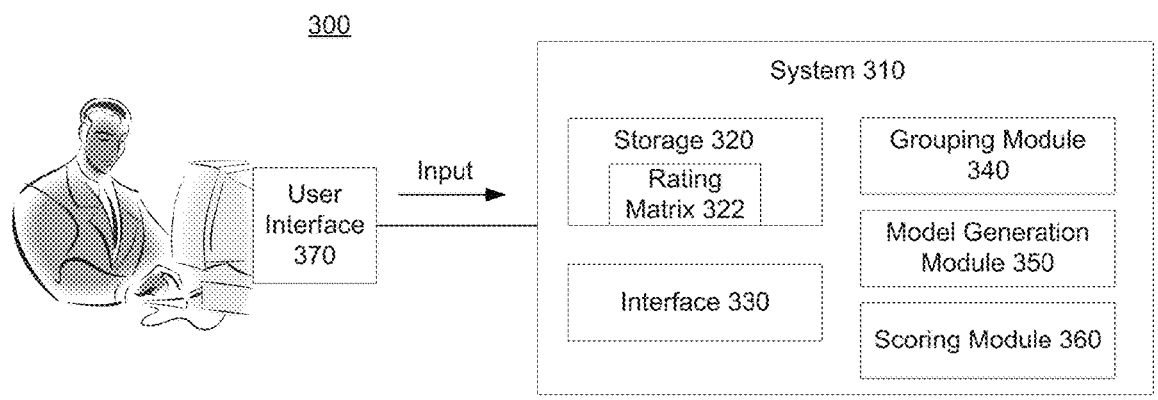
FIG. 3 illustrates a system for generating a model based on input, according to an example.

Methods 100 and 200 will be described here relative to environment 300 of FIG. 3. Environment 300 may include and/or be implemented by one or more computers. For example, the computers may be server computers, workstation computers, desktop computers, laptops, mobile devices, or the like, and may be part of a distributed system. The computers may include one or more controllers and one or more machine-readable storage media.

A controller may include a processor and a memory for implementing machine readable instructions. The processor may include at least one central processing unit (CPU), at least one semiconductor-based microprocessor, at least one digital signal processor (DSP) such as a digital image processing unit, other hardware devices or processing elements suitable to retrieve and execute instructions stored in memory, or combinations thereof. The processor can include single or multiple cores on a chip, multiple cores across multiple chips, multiple cores across multiple devices, or combinations thereof. The processor may fetch, decode, and execute instructions from memory to perform various functions. As an alternative or in addition to retrieving and executing instructions, the processor may include at least one integrated circuit (IC), other control logic, other electronic circuits, or combinations thereof that include a number of electronic components for performing various tasks or functions.

The controller may include memory, such as a machine-readable storage medium. The machine-readable storage medium may be any electronic, magnetic, optical, or other physical storage device that contains or stores executable instructions. Thus, the machine-readable storage medium may comprise, for example, various Random Access Memory (RAM), Read Only Memory (ROM), flash memory, and combinations thereof. For example, the machine-readable medium may include a Non-Volatile Random Access Memory (NVRAM), an Electrically Erasable Programmable Read-Only Memory (EEPROM), a storage drive, a NAND flash memory, and the like. Further, the machine-readable storage medium can be computer-readable and non-transitory. Additionally, system 300 may include one or more machine-readable storage media separate from the one or more controllers.

Environment 300 may include multiple components, such as a system 310 and a user interface 370. System 310 may include storage 320 for storing a rating matrix 322, an interface 330, a grouping module 340, a model generation module 350, and a scoring module 360. The environment may also include other components and databases. User interface 370 may be located locally to system 310, and may be a component thereof, or may be located remotely to system 310.

A user may provide input to system 310 via user interface 370. User interface 370 may be implemented by a computer application residing on a computer, such as a desktop computer, workstation computer, tablet computer, or the like. The user interface 370 may include suitable user interface technology, such as a touch interface, mouse, keyboard, gesture input device, etc. System 310 may be connected to user interface 370 via a network. The network may be any type of communications network, including, but not limited to, wire-based networks (e.g., cable), wireless networks (e.g., cellular, satellite), cellular telecommunications network(s), and IP-based telecommunications network(s) (e.g., Voice over Internet Protocol networks), The network may also include traditional landline or a public switched telephone network (PSTN), or combinations of the foregoing.

Method 100 may begin at 100, where a model may be generated from a rating matrix 322 by model generation module 350. The rating matrix may be a matrix containing users, items, and ratings. Each rating may indicate a preference of a particular user for a particular item, For example, the rating may be a yes/no indicator (e.g., 1 for "yes", 0 for "no") or may be a number in a range (e.g., 1 through 5, where 1 indicates no interest and 5 indicates significant interest). That rating matrix may be generated based on data collected and stored over time, such as purchasing behavior of consumers on an e-commerce website or movie watching behavior on a streaming movie website. That rating matrix may have missing ratings for particular users and items. The techniques described herein can be used to estimate a rating for a particular user-item pair where there is no rating indicated in the rating matrix. These estimated ratings, in conjunction with other known ratings, may be used to make meaningful predictions about users and items, such as predicting what item an active user would be most likely to purchase if it were recommended to him/her.

The model may be generated based on decomposing the rating matrix 322 into a product of two matrices U and V. The matrix U may represent correlations between the users in the rating matrix 322 and a plurality of factors. The matrix V may represent correlations between the items in rating matrix 322 and the plurality of factors. The factors are "hidden" factors that are assumed to influence the users' preferences for the items. The factors are referred to as "hidden" because they are not known by model generation module 350. Instead, they are estimated/generated through the mathematical technique of low rank matrix factorization, such as weighted non-negative matrix factorization. The number of factors generated for matrices U and V is dictated by model generation module 350. For example, the number of factors may be hard coded or may be specified by a user, such as through user interface 370.

In an example, the model may be generated based on decomposing the rating matrix into a product of two matrices U and V that minimize an objective function. In particular, given a rating matrix X and a yes/no indicator matrix of the observed entries in X, find the non-negative matrices U and V that minimize the objective function:

$$F(U,V)=\|Y*(X-UV^T)\|^2$$

where U is the matrix U, $V^T$ is the transpose of matrix V, X is the rating matrix providing observed ratings, Y is an indicator matrix corresponding to X in which every entry (u,v) contains 1 in case the rating of user u to item v is known and 0 otherwise, and * is a pointwise multiplication. In some cases, regularization constraints may be added to the objective function.

At 120, at least some of the users and/or items may be grouped into groups by grouping module 340 according to the correlations indicated by the generated model. For example, users and/or items may be grouped into groups based on the dominant factors indicated by the model. The dominant factors are the factors having a high correlation to users or items. For instance, there would be a high correlation between users and a particular factor if that factor represents a separation between users that prefer an item and users that do not prefer the item. In other words, if users associated with the factor generally (or always) prefer a certain item or group of items, and conversely users not associated with the factor generally (or always) do not prefer the certain item or group of items, that factor would have a high correlation and be a dominant factor.

An example in the movie context could be the following. The rating matrix may include movie watchers as users, movies as items, and a rating of 1 to 5 stars representing enjoyment of the movie. Assume there is a large group of users that generally rate a movie 4 or 5 stars if it has Brad Pitt in the cast. Thus, a hidden factor in movie preference for those users would be whether Brad Pitt played a part in the movie. However, whether Brad Pitt is in any of the movies is not indicated by the rating matrix, and thus even the existence of this characteristic is unknown to model generation module 350. Nonetheless, by creating the model as described above, this "Brad Pitt" hidden factor may be uncovered and represented in the model (though, again, the semantic information regarding what this factor represents is not present in the model). The reason why the hidden factor can be determined is because of the interrelationship between the multiple movies, movie watchers, and ratings in the rating matrix: since a subset of the movies will include Brad Pitt in the cast, the fact of this hidden factor may be uncovered simply based on the preferences of the large number of users for movies in that subset. Finally, because this factor influences movie preference for a large number of users, it may have a relatively high correlation in the model and may thus be considered a dominant factor.

The number of groups created may depend on the number of dominant factors indicated by the model. In one example, a certain percentage of the highest correlated factors may be selected as the dominant factors. For instance, the top 10%, 15%, or 20%. Alternatively, a certain number of factors may be selected as the dominant factors—say the top five. Alternatively, a certain threshold may need to be met for a factor to be considered a dominant factor. Regardless of method, the users and items correlated with each dominant factor may be grouped into a respective group. In some cases, a particular group may represent multiple factors. For example, if a user or item is highly correlated with two factors A and B, the user or item will be part of a group representing [A, B]. The user or item will not be part of a group representing just [A] or a group representing just [B]. This may be extended to more than two factors.

At 130, input may be received on one or more of the groups. The input may be received at interface 330 from a person operating user interface 370. The person may be a domain expert, meaning that the person has expertise or understanding regarding a particular domain. For instance, the person may have expertise in the area of movies and tastes of movie watchers. Also, the person may not be represented as a user in the rating matrix. The groups, with their member items and users, may be presented to the person via user interface 370. In the case of a group representing multiple factors, such as factors A and B as described above, the fact that the user or item in group [A, B] is also related to factors [A] and [B] separately may nonetheless be conveyed to the person. For example, a visualization on user interface 370 may display the groups in a way that the user can understand the correlations between them. For instance, factor A can be represented separately and can show connections to groups [A], [A, B], etc., and factor B may be represented separately and show connections to groups [B], [A, B], etc. In this way, the user can understand that group [A, B] is connected to both of the factors. A benefit of presenting the groups to the user is that it enables assessment of and changes to the model. For example, the person may be able augment the model by identifying common properties or links between items, users, or both, and/or may be able to correct errors in the model.

The received input may come in several forms. For example, the input may comprise: approval or disapproval that one or more of the users or items belongs to a particular group; moving one or more of the users or items to a particular group; indicating that one or more users or items are similar to one or more other users or items; merging or splitting one or more of the groups; and/or deleting one or more of the users or items from a particular group.

At 140, another model may be generated based on the input. For example, model generation module 350 may perform method 200 to generate a new model based on the input. At 210, a mathematical constraint reflecting the input may be added to the objective function. For example, to indicate approval that a user i is in a particular group g and not in other groups, the constraint $\|U_i - D(g)\|^2 =$ may be added to the objective function, where D is a vector containing a high value for every factor in group g and 0 for every factor not in g. As an additional example, to indicate that an item i is similar to an item j, the constraint $\|V_i - V_j\|^2 =$ may be added to the objective function. Also, deletion of an item or user will result in the item or user not being used in the generation of subsequent models. However, the deleted item or user may be added to the model later in order to enable recommendations for the deleted item or user. At 220, the rating matrix may be decomposed into a product of two new matrices U and V that minimize the objective function with the added constraint(s). As a result, the new model will take into account the received input.

After block 140, method 100 may iterate through blocks 120-140 multiple times to generate new models based on additional input. In an example, the accuracy of each model may be measured by scoring module 360. The accuracy may be a measure of how well the model replicates the user-item ratings in the rating matrix. After each iteration, the accuracy may be compared to one or more previous iterations to determine whether to continue with another iteration, backtrack, or end the process at block 150. Using these techniques, the generated models may increase in accuracy and/or in their semantic interpretation and result in a better model for a recommender system.

Figure 4:
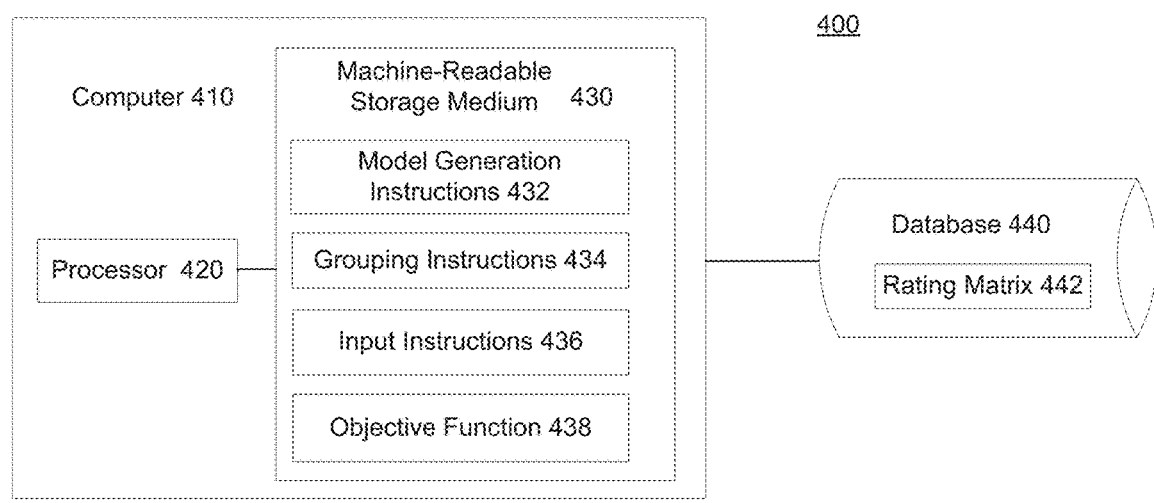
FIG. 4 illustrates a computer-readable medium for generating a model based on input, according to an example.

FIG. 4 illustrates a computer-readable medium to generate a model based on input, according to an example. Computer 410 may include and/or be implemented by one or more computers. For example, the computers may be server computers, workstation computers, desktop computers, laptops, mobile devices, or the like, and may be part of a distributed system. The computers may include one or more controllers and one or more machine-readable storage media, as described with respect to environment 300, for example.

In addition, users of computer 410 may interact with computer 410 through one or more other computers, which may or may not be considered part of computer 410. As an example, a user may interact with computer 410 via a computer application residing on a computer, such as a desktop computer, workstation computer, tablet computer, or the like. The computer(s) and computer application can include a user interface (e.g., touch interface, mouse, keyboard, gesture input device), such as user interface 370.

Computer 410 may perform methods 100 and 200, and variations thereof. Additionally, the functionality implemented by computer 410 may be part of a larger software platform, system, application, or the like. Computer 410 may be connected to database 440 via a network. The network may be any type of communications network, including, but not limited to, wire-based networks (e.g., cable), wireless networks (e.g., cellular, satellite), cellular telecommunications network(s), and IP-based telecommunications network(s) (e.g., Voice over Internet Protocol networks). The network may also include traditional landline or a public switched telephone network (PSTN), or combinations of the foregoing.

Processor 420 may be at least one central processing unit (CPU), at least one semiconductor-based microprocessor, other hardware devices or processing elements suitable to retrieve and execute instructions stored in machine-readable storage medium 430, or combinations thereof. Processor 420 can include single or multiple cores on a chip, multiple cores across multiple chips, multiple cores across multiple devices, or combinations thereof. Processor 420 may fetch, decode, and execute instructions 432-436 among others, to implement various processing. As an alternative or in addition to retrieving and executing instructions, processor 420 may include at least one integrated circuit (IC), other control logic, other electronic circuits, or combinations thereof that include a number of electronic components for performing the functionality of instructions 432-436. Accordingly, processor 420 may be implemented across multiple processing units and instructions 432-436 may be implemented by different processing units in different areas of computer 410.

Machine-readable storage medium 430 may be any electronic, magnetic, optical, or other physical storage device that contains or stores executable instructions. Thus, the machine-readable storage medium may comprise, for example, various Random Access Memory (RAM), Read Only Memory (ROM), flash memory, and combinations thereof. For example, the machine-readable medium may include a Non-Volatile Random Access Memory (NVRAM), an Electrically Erasable Programmable Read-Only Memory (EEPROM), a storage drive, a NAND flash memory, and the like. Further, the machine-readable storage medium 430 can be computer-readable and non-transitory. Machine-readable storage medium 430 may be encoded with a series of executable instructions for managing processing elements.

The instructions 432-436 when executed by processor 420 (e.g., via one processing element or multiple processing elements of the processor) can cause processor 420 to perform processes, for example, methods 100 and 200, and/or variations and portions thereof.

For example, model generation instructions 432 may cause processor 420 to access a rating matrix 442 comprising users, items, and ratings. A given rating in the rating matrix indicates a preference of one of the users for one of the items. Model generation instructions 432 may further cause processor 420 to generate a first model based on decomposing the rating matrix into a product of two matrices U and V that minimize an objective function 438. U may represent correlations between users and a plurality of factors and V may represent correlations between items and the plurality of factors. Grouping instructions 434 may cause processor 420 to group at least some of the users and items into groups according to the correlations. The grouping may be performed for only the most dominant factors, that is, the factors having the strongest correlations with users and/or items.

Input instructions 436 may cause processor 420 to receive input on one or more of the groups. For example, the input instructions may cause processor 420 to provide the groups to a user interface and receive input on the groups. The input may be received from a user, such as a domain expert, and may be in the format described previously. Model generation instructions 432 may then cause processor 420 to add a constraint to the objective function 438 reflecting the input. Model generation instructions 432 may further cause processor 420 to generate a second model based on decomposing the rating matrix 442 into a product of two new matrices U and V that minimize the objective function 438 with the added constraint. Further processing may be performed, as previously described with respect to methods 100, 200 and environment 300.

In the foregoing description, numerous details are set forth to provide an understanding of the subject matter disclosed herein. However, implementations may be practiced without some or all of these details. Other implementations may include modifications and variations from the details discussed above. It is intended that the appended claims cover such modifications and variatio

What is claimed is:

1. A method comprising:
   generating, by a processor, a first user-item preference model by decomposing a rating matrix comprising users, items, and ratings of the items provided by the users into a product of two matrices U and V, wherein the items, and the items include a plurality of components which are factors related to the items that caused the users to provide the ratings of the items, wherein the matrix U includes correlations between the users in the rating matrix and the factors related to the items and the matrix V includes correlations between the items in the rating matrix and the factors related to the items;
   grouping, by the processor, the users and items correlated to dominant factors in the matrices U and V into groups, wherein the dominant factors are factors whose correlations with the users and items in the matrices U and V are greater than a predetermined threshold representing a separation between users who prefer the items and users who do not prefer the items;
   receiving an input that revises the groups of the users and items;
   generating, by the processor, a second user-item preference model of the product of the matrices U and V based on the revised groups of the users and items after receipt of the input; and
   rendering for display, on a user interface, recommended items based on the second user-item preference model.

2. The method of claim 1, wherein the input comprises approving or disapproving that one or more of the users or items belongs to a particular group.

3. The method of claim 1, wherein the input comprises moving one or more of the users or items from one group to another group.

4. The method of claim 1, wherein the input comprises indicating that one or more users or items are similar to one or more other users or items.

5. The method of claim 1, wherein the input comprises merging or splitting one or more of the groups.

6. The method of claim 1, wherein the input comprises deleting one or more of the users or items such that the one or more of the users or items are not used to generate the second user-item preference model.

7. The method of claim 1, wherein generating the first user-item preference model by decomposing the rating matrix into a product of two matrices U and V comprises:
   generating the first user-item preference model by decomposing the rating matrix into a product of two matrices U and V that minimize an objective function.

8. The method of claim 7, wherein generating the second user-item preference model comprises:
   adding a mathematical constraint reflecting the input to the objective function; and
   generating the second user-item preference model by decomposing the rating matrix into a product of two new matrices U and V that minimize the objective function with the added mathematical constraint.

9. The method of claim 1, further comprising providing a first accuracy score for the first user-item preference model and a second accuracy score for the second user-item preference model, the first and second accuracy scores representing how closely the respective first and second user-item preference models' ratings match the ratings from the rating matrix.

10. The method of claim 1, wherein the input is received from a domain expert.

11. The method of claim 1, wherein the input is received from a user not represented in the rating matrix.

12. A system comprising:
an interface;
a processor; and
a memory storing instructions that when executed cause the processor to:
store a rating matrix comprising users, items, and ratings of the items provided by the users, wherein the items include a plurality of components which are factors related to the items that caused the users to provide the ratings of the items;
generate a first user-item preference model by decomposing the rating matrix into a product of two matrices U and V that minimize an objective function, wherein the matrix U includes correlations between the users in the rating matrix and the factors related to the items and the matrix V includes correlations between the items in the rating matrix and the factors related to the items;
group the users and items correlated to dominant factors in the matrices U and V into groups, wherein the dominant factors are factors whose correlations with the users and items in the matrices U and V are greater than a predetermined threshold representing a separation between users who prefer the items and users who do not prefer the items;
receive, by the interface, an input that revises the groups of the users and items;
generate a second user-item preference model of the product of the matrices U and V based on the revised groups of the users and items; and
render for display, on a user device, recommended items based on the second user-item preference model.

13. The system of claim 12, wherein to generate the second user-item preference model, the instructions are executable to cause the processor to: add a mathematical constraint reflecting the input to the objective function and generate the second user-item preference model by decomposing the rating matrix into a product of two new matrices U and V that minimize the objective function with the added mathematical constraint.

14. The system of claim 12, wherein the instructions are executable to cause the processor to calculate a first accuracy score for the first user-item preference model and a second accuracy score for the second user-item preference model, the first and second accuracy scores representing how closely the respective first and second user-item preference models' ratings match the ratings from the rating matrix.

15. A non-transitory computer-readable storage medium storing instructions for execution by a processor, the instructions when executed causing the processor to:
access a rating matrix comprising users, items, and ratings of the items provided by the users, wherein the items include components which are factors related to the items that caused the users to provide the ratings of the items;
generate a first user-item preference model based on decomposing the rating matrix into a product of two matrices U and V that minimize an objective function, wherein the matrix U includes correlations between the users in the rating matrix and the factors related to the items and the matrix V includes correlations between the items in the rating matrix and the factors related to the items;
group the users and items correlated to dominant factors in the matrices U and V into groups, wherein the dominant factors are factors whose correlations with the users and items in the matrices U and V are greater than a predetermined threshold representing a separation between users who prefer the items and users who do not prefer the items;
receive an input that revises the groups of the users and items;
add a constraint to the objective function reflecting the input;
generate a second user-item preference model based on decomposing the rating matrix into a product of two new matrices U and V that minimize the objective function with the added constraint; and
render for display, on a user interface, recommended items based on the second user-item preference model.

16. The non-transitory computer-readable storage medium of claim 15, wherein the input comprises moving a user or item from one group to another group, or deleting a user or item from one of the groups.

17. The non-transitory computer-readable storage medium of claim 15, wherein the input comprises merging two of the groups or splitting one of the groups.

18. The system of claim 12, wherein the input comprises moving a user or item from one group to another group, or deleting a user or item from one of the groups.

19. The system of claim 12, wherein the input comprises merging two of the groups or splitting one of the groups.

* * * * *